United States Patent [19]

Kondo et al.

[11] Patent Number: 5,266,441
[45] Date of Patent: Nov. 30, 1993

[54] IMAGE FORMING MEDIUM AND IMAGE FORMING METHOD

[75] Inventors: Yuji Kondo, Kashiwa; Masato Katayama, Yokohama; Tetsuro Fukui, Kawasaki; Kazuo Isaka; Akihiro Mouri, both of Tokyo, all of Japan

[73] Assignee: Canon Kabushiki Kaisha, Tokyo, Japan

[21] Appl. No.: 49,660

[22] Filed: Apr. 22, 1993

Related U.S. Application Data

[63] Continuation of Ser. No. 942,600, Jul. 24, 1992, abandoned, which is a continuation of Ser. No. 558,479, Jul. 27, 1990, abandoned.

[30] Foreign Application Priority Data

Jul. 29, 1989 [JP] Japan ............... 1-195418

[51] Int. Cl.$^5$ ............... G03C 1/71; G03C 1/68; G03C 7/00
[52] U.S. Cl. ............... 430/201; 430/270; 430/271; 430/280; 430/286; 430/287; 503/201; 503/208; 346/76 L; 346/76 PH
[58] Field of Search ............... 430/200, 201, 287, 270, 430/286, 271, 203, 280; 503/201, 208; 346/76 R, 76 PH

[56] References Cited

U.S. PATENT DOCUMENTS

| | | | |
|---|---|---|---|
| 3,245,796 | 4/1966 | Burg | 430/201 |
| 3,257,664 | 6/1966 | Leubret et al. | 430/287 |
| 3,275,437 | 9/1966 | Cohen | 430/203 |
| 4,006,018 | 2/1977 | Wiese | 430/201 |
| 4,587,198 | 5/1986 | Fisch | 430/201 |

FOREIGN PATENT DOCUMENTS

| | | | |
|---|---|---|---|
| 0169049 | 1/1986 | European Pat. Off. | |
| 0362827 | 4/1990 | European Pat. Off. | 430/201 |
| 0197806 | 6/1978 | Fed. Rep. of Germany | 430/201 |
| 3715991 | 11/1987 | Fed. Rep. of Germany | |
| 61-45241 | 3/1986 | Japan | |
| 61-69062 | 4/1986 | Japan | |
| 62-70836 | 4/1987 | Japan | |
| 62-75342 | 4/1987 | Japan | |
| 607096 | 11/1978 | Switzerland | |
| 1058798 | 2/1967 | United Kingdom | |

Primary Examiner—Richard L. Schilling
Attorney, Agent, or Firm—Fitzpatrick, Cella, Harper & Scinto

[57] ABSTRACT

An image forming medium comprising an image forming layer comprising at least a heat-diffusible coloring matter, a polymerizable binder and a polymerization initiator, wherein the polymerizable binder has a film-forming property and contains three or more polymerizing functional groups per one molecule.

13 Claims, 3 Drawing Sheets

IMAGE FORMING MEDIUM AND IMAGE FORMING METHOD

This application is a continuation of application Ser. No. 07/924,600 filed Jul. 24, 1992, now abandoned, which was a continuation of application Ser. No. 07/558,479 filed Jul. 27, 1990, now abandoned.

FIELD OF THE INVENTION AND RELATED ART

The present invention relates to an image forming medium for forming an image by utilizing a contrast between a polymerized portion and an unpolymerized portion, and to an image forming method using such an image forming medium.

As the conventional thermal (or heat-sensitive) recording method, there have mainly been used a direct thermal method, a thermal transfer method, a sublimation transfer method, etc.

In the direct thermal method, a color former (or color-forming member) capable of developing a color under heating is heated in a desired pattern by means of a thermal head, etc., so that a letter or image is formed. In this method, however, an uncolored portion of the resultant image tends to develop a color under the influence of heat or chemical agent, and therefore the resultant image is inferior in stability or storability. Further, it is difficult to obtain a color (or multi-color) image by using the direct thermal method.

In the thermal transfer recording method, an ink donor sheet prepared by coating a plastic film such as polyester film with a heat-fusible ink containing a coloring matter, etc., is used, and such a donor sheet is heated in a desired pattern by means of a thermal head, etc., to melt the ink of the donor sheet, and the thus melted ink is transferred to an image-receiving paper adjacent to the donor sheet, whereby an image is formed. In this method, a multi-color image may be formed by superposing plural colors, but it is necessary to use a special device or special donor sheet, in order to obtain an image having a gradation property in image density In the sublimation transfer method, an ink donor sheet prepared by coating a resin film with an ink containing a sublimable dye is used, and such a donor sheet is heated in a desired pattern by means of a thermal head, etc., to selectively sublime the dye contained in the heated portion of the donor sheet, and the thus sublimed dye is transferred to an image-receiving paper etc., whereby an image is formed. In this method, unlike the above-mentioned thermal transfer recording method, an image having a gradation property in image density may be obtained by controlling the thermal head, heat energy application, heat application time, etc. However, it is not easy to precisely control these items. Further, in this method, since the thermal head generally repeats on-off heat generation at intervals of 1 msec, desired sublimation and image density cannot be obtained until the thermal head is heated to a considerably high temperature. However, when the donor sheet is heated up to such a high temperature, not only the sublimable dye but also a binder component contained in the donor sheet is transferred to the image-receiving member, whereby the image quality of the resultant image is lowered in some cases.

Japanese Laid-Open Patent Application (JP-A, KOKAI) Nos. 69062/1986, 70836/1987, and 75342/1986 disclose that an image comprising a polymerized portion and an unpolymerized portion is formed, and the polymerized or unpolymerized portion is selectively subjected to adhesive transfer or etching, thereby to provide an image comprising a polymer.

Further, Japanese Laid-Open Patent Application No. 45241/1986 discloses that an image comprising a polymerized portion and an unpolymerized portion is formed in a medium containing a dye or pigment, and a color image is formed by utilizing a difference in vaporization rate of the dye or pigment between the polymerized and unpolymerized portions under heating of the above-mentioned medium.

In the above-mentioned methods utilizing polymerized and unpolymerized portions, however, there is still room for improvement with respect to the sensitivity to polymerization and contrast between the polymerized and unpolymerized portions.

SUMMARY OF THE INVENTION

An object of the present invention is to provide an image forming medium and an image forming method capable of stably forming a latent image based on polymerization having a good contrast more quickly.

Another object of the present invention is to provide an image forming medium and an image forming method capable of providing a color (or multi-color) image having an excellent resolution without color fog.

According to the present invention, there is provided an image forming medium comprising an image forming layer comprising a heat-diffusible coloring matter, a polymerizable binder and a polymerization initiator, wherein the polymerizable binder has a film-forming property and contains three or more polymerizing functional groups per one molecule.

The present invention also provides an image forming method, comprising;

providing an image forming medium as described above;

imparting a pattern of light or heat to the image forming medium to patternwise polymerize the image forming layer, thereby to form therein a latent image;

causing the image forming medium to contact an image-receiving member and heating the image forming medium, thereby to form an image corresponding to the patternwise polymerized image forming layer on the image-receiving member The present invention further provides an image forming method, comprising;

(a) providing an image forming medium as described above;

(b) imparting a pattern of light or heat to the image forming to patternwise polymerize the image-forming layer part, thereby to form therein a latent image;

(c) causing the image forming medium to contact an image-receiving member and heating the image forming medium, thereby to form an image corresponding to the patternwise polymerized image-forming layer part on the image-receiving member.

The present invention further provides an image forming method, comprising;

(a) providing an image forming medium as described above;

(b) imparting a pattern of light or heat to the image-forming medium to patternwise polymerize the polymerizing layer, thereby to form therein a latent image;

(c) causing the image forming medium to contact an image-receiving member and heating the image forming medium, thereby to form an image corresponding to the patternwise polymerized polymerizing layer on the image-receiving member.

The present invention further provides an image forming method, comprising:

providing an image forming medium as described above;

imparting a pattern of light or heat to the image forming medium to patternwise polymerize the image forming layer, thereby to form therein a latent image; and heating the image forming medium so that the heat-diffusible coloring matter may patternwise remain in the image forming layer.

These and other objects, features and advantages of the present invention will become more apparent upon a consideration of the following description of the preferred embodiments of the present invention taken in conjunction with the accompanying drawings.

DETAILED DESCRIPTION OF THE INVENTION

Figure 1:
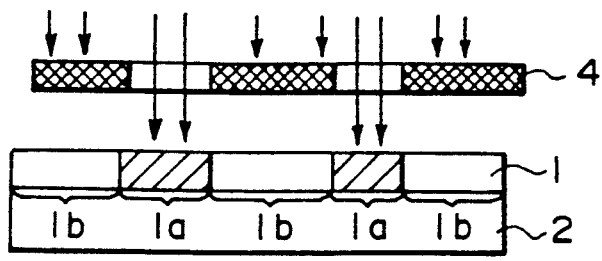
FIG. 1 is a schematic side sectional view showing an embodiment of the latent image formation step constituting the image forming method according to the present invention.

Referring to FIG. 1, the image forming medium according to the present invention may preferably comprise a support 2 and an image forming layer 1 disposed thereon. The image forming layer 1 comprises at least a heat-diffusible (or heat-vaporizable) coloring matter, a polymerizable binder and a polymerization initiator. The image forming layer 1 can also contain a polymerizable compound other than the polymerizable binder, as desired. The polymerizable binder to be used in the present invention is a binder which not only has a film-forming property and a binding property, but also is capable of causing a polymerization reaction.

In order to form an image by using the above-mentioned image forming medium, there may be used a latent image-forming step as shown in FIG. 1. In such a latent image-forming step, an image forming layer 1 is exposed to light including an absorption wavelength for the photo-polymerization initiator contained in the image forming layer 1, by the medium of an appropriate mask 4 having a predetermined pattern to polymerize the polymerizable binder (and an optional polymerizable compound) contained in the image forming layer 1, whereby a latent image comprising a polymerized portion 1a and an unpolymerized portion 1b corresponding to the pattern of the mask 4 is formed in the image forming layer 1.

The mask 4 used herein should not be restricted to one comprising a transmissive portion and a non-transmissive portion, but may be a gradation mask having a semi-transmissive (or translucent) portion, such as photographic negative. When analog exposure is conducted by using such a gradation mask, gradational polymerization may be conducted corresponding to the mask pattern, and therefore a gradational latent image corresponding to the mask pattern may be formed.

In the present invention, digital exposure and/or analog exposure other than the above-mentioned exposure using a mask 4 may also be used. Further, thermal polymerization using a thermal head or thermal pen may also be used, in addition to the above-mentioned photo-polymerization. Moreover, exposure and heating may simultaneously be conducted so to increase the polymerization rate. However, in a case where heating is conducted, it is preferred to heat the medium at a temperature which is lower than the vaporization (or diffusion) temperature at which the heat-diffusible coloring matter contained in the medium is vaporized or diffused.

When exposure is conducted in the above-mentioned step, there may be used, a sunbeam, a tungsten lamp, a mercury lamp, a halogen lamp, a xenon lamp, a fluorescent lamp, etc., as a light source.

In the present invention, it is possible to conduct imagewise exposure by using, e.g., a liquid crystal shutter array, a CRT, an optical fiber tube, etc., without using a mask 4.

Figure 2:
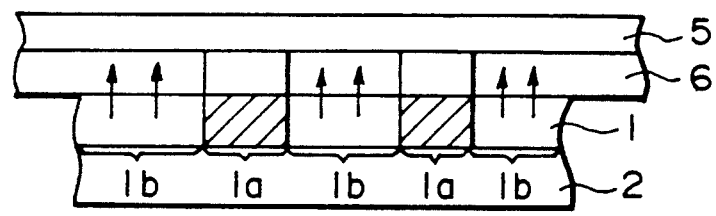
FIG. 2 is a schematic side sectional view showing an embodiment of the heating step constituting the image forming method according to the present invention.
Figure 3:
FIG. 3 is a schematic side sectional view showing an embodiment of the image-receiving member wherein an image has been formed by the image forming method according to the present invention.

Then, in a heating step as shown in FIG. 2, when the image forming layer 1 wherein a latent image has been formed is superposed on an image-receiving layer 6 disposed on a substrate 5 and heated, the heat-diffusible coloring matter contained in the unpolymerized portion 1b is transferred to the image-receiving layer 6 on the basis of the diffusion of the heat-diffusible coloring matter. On the other hand, the diffusion transfer of the heat-diffusible coloring matter contained in the polymerized portion 1a is suppressed, since such diffusion transfer is obstructed by the polymer chain contained in the polymerized portion 1a.

The image-receiving layer 6 used herein is not particularly restricted as long as the heat-diffusible coloring matter can be well diffusion-transferred thereto so as to form a good image, and therefore the image-receiving layer 6 may comprise one selected from various material. More specifically, the image-receiving layer 6 may comprise: polyester resin, polycarbonate resin, polyvinyl acetate resin, polyurethane resin, polyamide resin, polycaprolactone resin, polyvinyl chloride resin, etc.

When the image forming medium is separated or peeled from the image-receiving layer 6 after the heat-diffusible coloring matter is selectively diffusion-transferred with respect to the polymerized portion 1a and unpolymerized portion 1b in the above-mentioned manner, an image comprising the heat-diffusible coloring matter may be provided in the image-receiving layer 6. The thus obtained image may be excellent in contrast, brightness and saturation.

In the present invention, it is also possible to heat the image forming medium without using an image-receiving member comprising a substrate 5 and an image-receiving layer 6 disposed thereon, so as to selectively remove the heat-diffusible coloring matter contained in the unpolymerized portion 1b due to diffusion, whereby an image comprising the heat-diffusible coloring matter remaining in the polymerized portion 1a may be formed.

In the above-mentioned heating step according to the present invention, the heating temperature may preferably be 70°-250° C., more preferably 80°-160° C., while it may also vary depending on various conditions. As the heating means, it is possible to use a hot plate, a heat roller, a thermal head, etc. In addition, it is possible that a heat-generating element is provided in the substrate 2 and an electric current is applied thereto to generate heat; or heating is effected by using an infrared light source or laser light irradiation.

The diffusion of the head-diffusible coloring matter may be suppressed corresponding to the polymerization degree (or degree of polymerization) of the polymerizable binder (and optional polymerizable compound), and the diffusion of the heat-diffusible coloring matter may be suppressed more firmly as the polymerization degree becomes higher. Accordingly, the exposure is conducted by using a mask comprising a transmissive portion and a non-transmissive portion, polymerization occurs in a portion of the image forming layer corresponding to the transmissive portion so as to suppress the diffusion of the heat-diffusible coloring matter contained therein, while polymerization is not promoted in a portion of the image forming layer corresponding to the non-transmissive portion so that the diffusion of the heat-diffusible coloring matter occurs, whereby a color image is formed. In a case where gradation polymerization is conducted by using a gradation mask, the diffusion of the heat-diffusible coloring matter is suppressed depending on the resultant polymerization degree, whereby a gradational color image is formed.

In a case where a multi-color image is intended to be formed, as specifically described hereinafter, there may be used a medium comprising a support and plural image forming layers respectively containing, e.g., heat-diffusible coloring matters of yellow, magenta and cyan, disposed on the same support. Further, it is also possible that three species of mono-color image forming media each of which comprises a support and one layer selected from those having the above-mentioned three colors are used, and the above-mentioned polymerization step and transfer step are sequentially repeated with respect to each image forming medium, whereby a multi-color image is formed.

In the present invention, the term "polymerized portion" refers to a portion which has positively been subjected to polymerization in a latent image formation step. The term "unpolymerized portion" includes not only a portion which has not been subjected to polymerization at all, but also a substantially unpolymerized portion, e.g., a portion which has been subjected to polymerization to such an extent that the good diffusion property of the heat-diffusible coloring matter is not substantially prevented (or to such an extent that the image formation is not substantially affected). The term "latent image" refers to a desired pattern comprising a polymerized portion and an unpolymerized portion. Further, the term "polymerization" used in the present invention also includes "crosslinking".

Next, there is specifically described the image forming medium according to the present invention.

The heat-diffusible coloring matter to be used in the present invention may comprise, e.g., a heat-diffusible dye, a diffusible substance which is capable of being diffused due to heat and reacting with a developer so as to produce a color, etc. Specific examples thereof may include: monoazo dyes, thiazole azo dyes, anthraquinone dyes, triarylmethane dyes, rhodamine dyes, naphthol dyes, triarylmethane-type coloring matters, fluoran-type coloring matters, phthalide-type coloring matters, etc.

In general, the heat-diffusible coloring matter may provide a larger heat-diffusibility as the molecular weight thereof becomes lower, and may provide a smaller heat-diffusibility as it contains larger amount of a polar group such as carboxyl group, amino group, hydroxyl group, nitro group, and sulfone group. In the present invention, a substance having a desired heat-diffusibility may appropriately be selected in view of its molecular weight, polar group content, etc., corresponding to polymerization degree, crosslinking density, heating condition, etc.

In the present invention, a higher content of the heat-diffusible coloring matter is preferred since a higher image density may be provided on an image-receiving member. However, when such a content becomes too high, the coloring matter can sometimes inhibit the function of a polymerization initiator, whereby the resultant polymerization reaction rate can undesirably be lowered in some cases. From such a viewpoint, the heat-diffusible coloring matter content may preferably be 2.5-50 wt. %, more preferably 5-20 wt. % based on the image recording (or forming) layer.

In a case where the heat-diffusible coloring matter comprises a substance (e.g., leuco dye) which is capable of being diffused due to heat and reacting with a developer contained in an image-receiving member, etc., so as to produce a color, such a developer may be incorporated into the image-receiving member. Specific examples of the developer may include: zinc oxide, calcium sulfate, novalak-type phenolic resin, zinc 3,5-dimethyl-tert-butylsalicylate, etc.

The polymerizable binder to be used in the present invention is one which is not only polymerizable but also has a film-forming property and a binding property so that it has a function of retaining the image forming layer 1 containing it in a layer form.

The polymerizable binder used in the present invention may be a polymerizable compound having a polymerizing functional group (such as reactive vinyl group) in an end portion and/or a side chain of an oligomer or polymer. The polymerizable binder is capable of being formed into a film or layer shape when it is dissolved in a solvent, applied onto a substrate and the solvent is evaporated, or it is melted and extruded onto a substrate so that the substrate is coated therewith.

In the polymerizable binder, it is sufficient that the polymerizing functional group is bonded to the end portion or side chain of an oligomer or polymer, as a main chain of the polymerizable binder. In the present invention however, it is preferred that the polymerizing functional group is bonded to the side chain as well as both of the end portions of the polymerizable binder. The polymerizable binder may preferably have three or more polymerizing functional groups per one molecule. The number of the polymerizing functional groups may preferably be 1000 or smaller per one molecule. The number of the polymerizing functional groups contained in the polymerizable binder may more preferably be 10-700, particularly 20-500, per one molecule.

Measurement of number of polymerizing functional group (reactive vinyl group) per one molecule Reactive vinyl groups contained in the polymerizable binder may be measured according to the Hübl's iodine value measurement method, while it can also be measured according to another known method. An embodiment of the above-mentioned measurement method is described below.

1.0 g of a polymerizable binder is weighted in a 1 liter-flask, and 10 ml of chloroform is added thereto to dissolve the binder.

Separately, a solution obtained by dissolving 25 g of iodine in 500 ml of 95%-alcohol, and a solution obtained by 30 g of mercuric chloride in 500 ml of alcohol are mixed in equal amounts thereby to prepare an iodine solution, before 24 hours counted from the actual use thereof.

25 ml of the thus prepared iodine solution is added to the above-mentioned solution of the polymerizable binder, and the resultant mixture is sufficiently shaken and thereafter left-standing in a dark place for 12 hours.

Separately, a blank solution is prepared in another flask in the same manner as described above except that the polymerizable binder is omitted After 12 hours, 20 ml of 10%-potassium iodide solution and 500 ml of distilled water are added to each of the above-mentioned flasks, sufficiently shaken, and each of the resultant two mixtures is subjected to titration by using a $0.1N$—$Na_2S_2O_3$ solution.

Based on the above measurement, the amount of the iodine absorbed in the polymerizable binder is determined by subtracting the amount of the $0.1N$—$Na_2S_2O_3$ solution consumed in the blank flask from that consumed in the sample flask containing the polymerizable binder. The iodine value (or iodine number) is determined according to the following formula:

$$\text{Iodine value} = 0.127 \times V \times N \times 100/w \quad (a)$$

V: amount of the $0.1N$—$Na_2S_2O_3$ solution consumed in the sample flask containing the polymerizable binder.
N: Normality of the $Na_2S_2O_3$ solution
w: Weight (g) of the polymerizable binder The theoretical iodine value of one double bond is represented by the following formula:

$$\text{Theoretical iodine value} = 254 \times 100/M \quad (b),$$

wherein M denotes the number-average molecular weight of the binder.

As a result, the number of double bonds (i.e., reactive vinyl groups) per one molecule may be represented by [measured iodine value (a)]/[theoretical iodine value (b)].

The polymerizable binder used in the present invention may preferably have a tensile strength of 1–1000 kg/cm$^2$, more preferably 10–800 kg/cm$^2$ when a film consisting of the polymerizable binder is subjected to measurement according to ASTM D638, so that it may retain the image forming layer in a layer form.

Measurement according to ASTM D638

A polymerizable binder alone is dissolved in an appropriate solvent such as methyl ethyl ketone and ethanol, or is melted under heating, and formed into a plate form having a thickness of about 6 mm. The thus obtained plate is then formed into a type-II test piece, is pulled at a speed B chosen in accordance with ASTM D638, and the resultant strength at this time is measured.

The polymerizable binder may for example be prepared by using each of the following combinations.

(1) A polymerizable binder obtained by reacting an oligomer or polymer having a carboxyl group with a monomer which has at least one of a hydroxyl group, an amino group, a glycidyl group, and an isocyanate group, and further has an unsaturated double bond.

(2) A polymerizable binder obtained by reacting an oligomer or polymer having a hydroxyl group with a monomer which has at least one of a carboxyl group, an isocyanate group, and a glycidyl group, and further has an unsaturated double bond.

(3) A polymerizable binder obtained by reacting an oligomer or polymer having an isocyanate group with a monomer which has at least one of a carboxyl group, a hydroxyl group, and an amino group, and further has an unsaturated double bond.

(4) A polymerizable binder obtained by reacting an oligomer or polymer having a glycidyl group with a monomer which has at least one of a hydroxyl group, an amino group, and a carboxyl group, and further has an unsaturated double bond.

(5) A polymerizable binder obtained by reacting an oligomer or polymer having an amino group with a monomer which has at least one of a glycidyl group, an isocyanate group and a carboxyl group, and further has an unsaturated double bond.

Specific examples of the above-mentioned polymer or oligomer constituting a main chain of the polymerizable binder may include: homopolymers of acrylic acid, methacrylic acid, and maleic anhydride; copolymers comprising a monomer constituting these homopolymers and another monomer such as acrylic-type monomers, and styrene-type monomers; homopolymers such as polyvinyl alcohol, polyvinyl acetal, polyvinyl butyral, celluloses, phenolic resins, hydroxyethyl acrylate, and hydroxyethyl methacrylate; copolymers comprising a monomer constituting these homopolymers and another monomer such as acrylic-type monomers, and styrene-type monomers; homopolymers such as saturated poyester, polymethylene diisocyanate, polyurethane resin having an isocyanate group, epi-bis type epoxy resin, novalak-type epoxy resin, and glycidyl methacrylate; copolymers comprising a monomer constituting these homopolymers and another monomer such as acrylic-type monomers, and styrene-type monomers; polyacrylamine, polyamide, etc.

Specific examples of the monomer for introducing an unsaturated double bond into the above-mentioned polymer or oligomer may include: hydroxyethyl acrylate, hydroxypropyl acrylate, hydroxyethyl methacrylate, hydroxypropyl methacrylate, butanediol monoacrylate, bis(acryloxyethyl)hydroxyethyl isocyanurate, glycerol acrylate, glycerol diacrylate, glycerol methacrylate, glycerol dimethacrylate, pentaerythritol triacrylate, pentaerythritol diacrylate, polyethylene glycol methacrylate, polypropylene glycol methacrylate, glycidyl acrylate, acrylic acid, methacrylic acid, phthalic acid acrylate, phthalic acid methacrylate, succinic acid acrylate, isocyanate ethyl methacrylate, etc.

Preferred examples of the polymerizable binder to be prepared by using the above-mentioned combinations (1) to (5) are described below.

A polymerizable binder represented by the following formula (I) may be prepared from a partially saponified polyvinyl alcohol and acrylic acid.

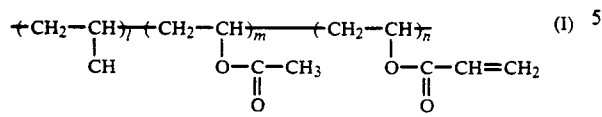  (I)

A polymerizable binder presented by the following formula (II) may be prepared from polyvinyl butyral and acrylic acid chloride.

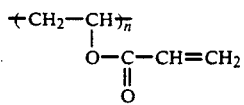

A polymerizable binder represented by the following formula (III) may be prepared from a maleic anhydride-type polymer and hydroxyethyl acrylate.

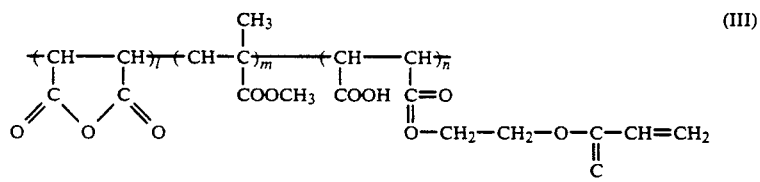 (III)

A polymerizable binder represented by the following formula (IV) may be prepared from a bisphenol A-type epoxy resin and acrylic acid.

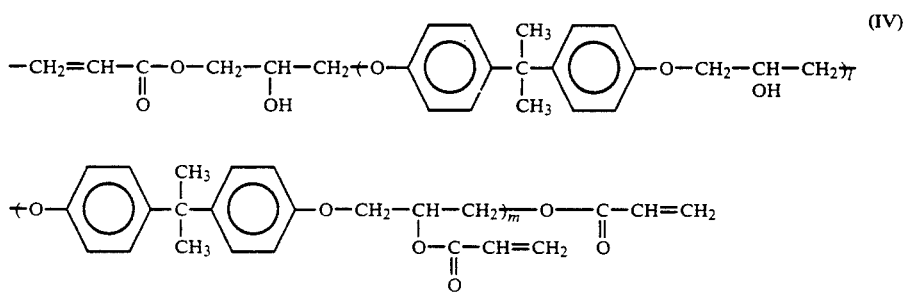 (IV)

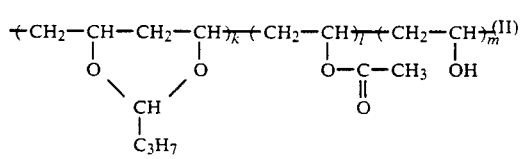 (II)

A polymerizable binder represented by the following formula (V) may be prepared form a Novolak-type epoxy resin and acrylic acid chloride.

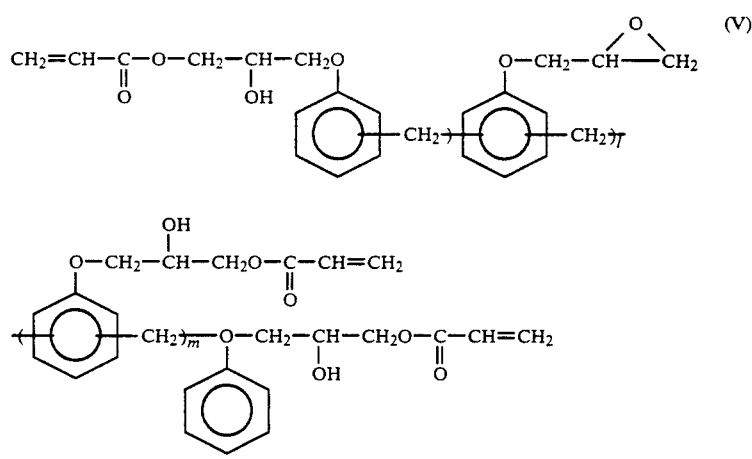 (V)

A polymerizable binder represented by the following formula (VI) may be prepared from a an acrylic resin and glycidyl acrylate.

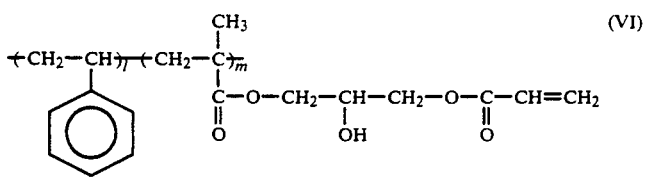

(VI)

When the polymer or oligomer constituting a main chain of the polymerizable binder has too high a molecular weight, the mobility of the binder molecules may be lowered to decrease its reactivity. On the other hand, the polymerizable binder used in the present invention is also required to have a film-forming property. Accordingly, the polymerizable binder may preferably have a molecular weight of $5 \times 10^3$ to $100 \times 10^4$, more preferably $1 \times 10^4$ to $60 \times 10^4$.

The molecular weight of the polymerizable binder used herein may be measured by using a GPC (gel permeation chromatography) and a calibration curve based on polystyrene standard samples.

The polymerizable binder may preferably have a glass transition temperature of $-30°$ C. or higher, more preferably $0°$ C. or higher.

In the present invention, the polymerizable binder can also contain an unreacted monomer, oligomer or polymer remaining therein.

In addition, polymerizable binders as described in "Kinouzairyou" edited and published by Shii-Emu-Shii K.K., P. 48, December 1983 can also be used in the present invention.

In the present invention, the polymerization initiator may comprise a photopolymerization initiator or a thermal polymerization initiator.

The thermal polymerization initiator may be a known initiator such as azo-type initiator and peroxide-type initiator The azo-type initiator is an organic compound having at least one nitrogen-nitrogen double bond in the molecule. Specific examples thereof may include: azobisisobutyronitrile, azobis-valeronitrile, azobispropionitrile, diazoaminobenzene, nitrosoacylarylamines, azothioethers, p-nitrobenzenediazonium salt, etc.

The peroxide-type initiator may be one selected from almost all organic compounds having at least one oxygen-oxygen bond. Specific examples thereof may include: peroxysuccinic acid, benzolyl peroxide, acetyl peroxide, lauroyl peroxide, methyl ethyl ketone peroxide, cumenehydroperoxide, t-butyl hydroperoxide, di-t-butyl peroxide, etc. However, the thermal polymerization initiator used in the present invention should not be restricted to the above-mentioned specific examples thereof, but can also be another thermal polymerization initiator known in the art.

The photopolymerization initiator may for example comprise a carbonyl compound, a sulfur-containing compound, a halogen-containing compound, a redox-type photopolymerization initiator, etc.

Specific examples of the carbonyl compound may include: diketones such as benzil and camphorquinone; benzophenones, acetophenones, benzoin alkyl ethers, thioxanthones such as 2-chlorothioxanthone, 2,5-diethylthioxanthone, and thioxanthone-3-carboxylic acid-$\beta$-methoxyethyl ester; cumarins, etc.

Specific examples of the sulfur-containing compound may include disulfides such as dibenzothiazolyl sulfide.

Specific examples of the halogen-containing compound may include: carbon tetrabromide, quinolinesulfonyl chloride, s-triazines having a trihalomethyl group.

Specific examples of the redox-type photopolymerization initiator may include: an initiator comprising a combination of a compound containing a trivalent iron ion (e.g., citric acid ferric ammonium) and a peroxide, etc.; a combination of a photoreduction substance such as riboflavin and Methylene Blue, and a reducing agent such as triethanolamine and ascorbic acid; etc.

It is possible to combine two or more species of the above-mentioned photopolymerization initiator so as to provide a more effective photopolymerization reaction.

In the present invention, it is also possible to use a combination of a thermal polymerization initiator and a photopolymerization initiator as described above.

The image forming medium according to the present invention can contain a polymerizable compound other than the above-mentioned polymerizable binder, as desired. Such a polymerizable compound may for example be a monomer containing a reactive vinyl group. Specific examples of the above-mentioned reactive vinyl group may include: substituted or unsubstituted vinyl groups having a polymerizability such as styrene-type vinyl groups, acrylic acid-type vinyl groups, methacrylic acid-type vinyl groups, allyl-type vinyl groups, vinyl ether-type vinyl groups, and ester-type vinyl groups including those of vinyl acetate, etc.

Specific examples of the polymerizable compound satisfying the above-mentioned conditions may include; styrene, acrylic acid, acrylamide, methacrylic acid, methyl methacrylate, vinylpyridine, N-vinylpyrrolidone, N-vinylimidazole, propyl vinyl ether, divinylbenzene, distyryl oxalate, distyryl terephthalate, di(acryloyloxyethyl)maleate, ethylenediacrylamide, 1,4-phenylenebis(acryloyloxyethoxy), 1,4-bis(acryloyloxyethoxycarbamoyl)benzene, di(methacryloyloxyethyl)-maleate; 1,4-phenylenebis(methacryloyloxyethoxy), pentaerythritol triacrylate, pentaerythritol trimethacrylate, cyanuric triacrylate, 1,1,1-trimethylolpropane triacrylate, 1,1,1-trimethylolpropane trimethacrylate, 1,1,1-trimethylolpropane tri(ethylacrylate), ethylenetetraacrylamide, pentaerythritol tetraacrylate, dipentaerythritol monohydroxy pentaacrylate, dipentaerythritol hexaacrylate, etc.

It is further preferred to use a multi-functional polymerizable compound in combination with the polymerizable binder. It is possible to use two or more species of the above-mentioned polymerizable compounds.

The image forming medium according to the present invention can contain a binder having no polymerizability, as desired, in addition to the above-mentioned heat-diffusible coloring matter, polymerization initiator, and polymerizable binder (and optional polymerizable compound). Such a binder may be one selected from a wide scope of resins. Specific examples thereof may include: cellulose esters such as nitrocellulose, cellulose phosphate, and cellulose sulfate; cellulose ethers such as methylcellulose and ethyl cellulose; vinyl resins such as polystyrene and polyvinyl butyral; copolymer resins such as styrene-butadiene copolymer, and styrene-acrylonitrile copolymer; acrylic resins such as polymethyl methacrylate and polyacrylic acid; polyarylates; polyamides; epoxy resins, phenolic resins; polyolefins such as chlorinated polyethylene; and natural polymers such as gelatin.

In the present invention, in a case where the film-forming property, etc., of the image forming layer are sufficiently provided by the polymerizable binder, it is possible that the image forming medium does not contain the above-mentioned optional binder.

In addition, it is possible to add an optional additive to the image forming medium according to the present invention. Specific examples of such an additive may include a photo-fading inhibitor, a surfactant, an antistatic agent, etc.

In the present invention, the polymerizable binder content may preferably by 5-98 wt. %, more preferably $20 \geq 85$ wt. %, based on the weight of the image forming layer.

The polymerization initiator content may preferably be 0.1-30 wt. parts, more preferably 0.5-20 wt. parts per 100 wt. parts of the polymerizable binder (or per 100 wt. parts of the polymerizable binder and a polymerizable compound other than the polymerizable binder in total, when such a polymerizable compound is also contained in the image forming medium).

In a case where the above-mentioned polymerizable compound is used in combination with the polymerizable binder, the polymerizable binder content may preferably be 5 wt. % or higher, more preferably 15 wt. % or higher, based on the total weight of the polymerizable binder and the polymerizable compound.

The image forming medium according to the present invention may be prepared by dissolving predetermined components constituting an image forming layer in a solvent, applying the resultant coating liquid onto a support such as metal, plastic or paper, and drying the resultant coating. An image forming layer can also be formed alone without using a support, when the image forming layer may retain its strength by itself. The support may preferably have a thickness of 1 micron to 5 mm, more preferably 10 microns to 2 mm.

The shape or form of the image forming medium according to the present invention should not particularly be restricted. More specifically, the image forming medium can have a flat plate form, a cylindrical form, etc. The image forming layer may preferably have a thickness of about 0.1 micron to 2 mm, more preferably about 1 micron to 1 mm. In a case where the image forming layer have a multi-layer structure as described hereinafter, the total thickness of the image forming layer may preferably be in the above-mentioned range.

Figure 4:
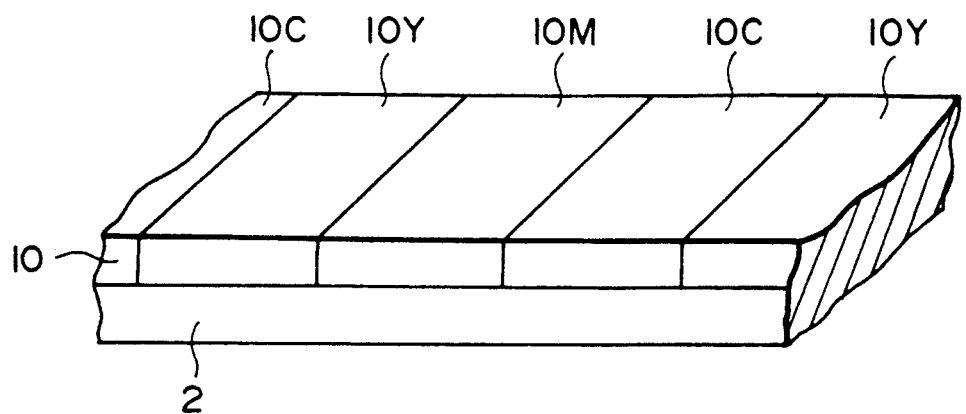
FIG. 4 is a schematic perspective view showing an embodiment of the image forming medium for multi-color recording according to the present invention.

In an embodiment wherein a multi-color image is formed by using the image forming medium according to the present invention, the image forming medium may preferably comprise an image forming layer 10 comprising plural image forming layer parts 10Y, 10M and 10C having mutually different color tones disposed in a planar direction, as shown in FIG. 4. For example, the image-forming layer part 10Y may contain a yellow heat-diffusible coloring matter, the image-forming layer part 10M may contain a magenta heat-diffusible coloring matter, and the image-forming layer part 10C may contain a cyan heat-diffusible coloring matter. Each of the image-forming layer parts 10Y, 10M and 10C may comprise the same components as those constituting the image forming layer 1 described with reference to FIG. 1. The arrangement of the image-forming layer parts 10Y, 10M and 10C are not particularly restricted but may preferably be one wherein these image-forming layer parts are repeated with a certain regularity. Further, the color tones of the image-forming layer parts 10Y, 10M and 10C are not particularly restricted.

Figure 5:
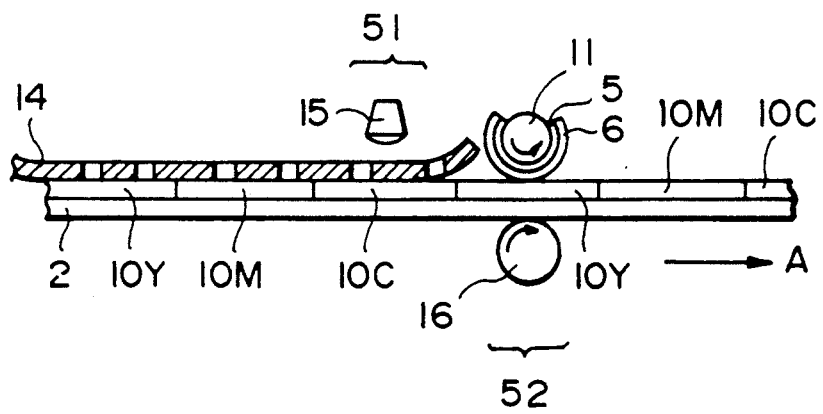
FIG. 5 is a schematic side sectional view showing an embodiment of the image forming method using the image forming medium as shown in FIG. 4.

In order to effect multi-color recording by using the image forming medium for multi-color recording as shown in FIG. 4, a recording method as shown in FIG. 5 may for example be used.

More specifically, in an apparatus embodiment as shown in FIG. 5, there are disposed, along the moving direction of an image forming medium, a latent image-forming section 51 for forming a latent image in an image forming layer comprising image-forming layer parts 10Y, 10M and 10C, and a heating section 52 for heating the image forming layer so as to effect the transfer of a heat-diffusible coloring matter contained in the image forming layer. In FIG. 5, the image forming medium is moved in the arrow A direction and passed through the latent image-forming section 51 and the heating section 52 so that each of the image-forming layer parts 10Y, 10M and 10C may sequentially be subjected to image exposure and heat transfer operations.

The image exposure and heat transfer operations used herein may be the same as described with reference to FIGS. 1 and 2. In the multi-color recording shown in FIG. 5, however, there is use a mask 14 corresponding to colors provided by the respective heat-diffusible coloring matters contained in the image-forming layer parts. More specifically, in the embodiment shown in FIG. 5, a mask for yellow is used corresponding to the image forming layer part 10Y containing a yellow colorant, a mask for magenta is used corresponding to the image forming layer part 10M containing a magenta colorant, and a mask for cyan is used corresponding to the image forming layer part 10C containing a cyan colorant, respectively. The mask 14 shown in FIG. 5 comprises mask portions respectively corresponding to the above-mentioned image-forming layer parts in view of easiness in operation. However, plural masks for respective colors may also be used instead of such a mask 14.

As described above, in an image-receiving layer 6, a yellow recording image, a magenta recording image and a cyan recording image are superposed, thereby to form a multi-color image. The image-receiving layer 6 disposed on a substrate 5 is wound around the peripheral surface of a rotating roller 11 in synchronism with the movement of the image forming medium, so as to provide accurate matching or superposition of recording images of respective colors.

In FIG. 5, a reference numeral 15 denotes an exposure device for effecting image exposure which may preferably be one capable of radiating plural species of lights having different wavelengths.

In the image forming medium for multi-color recording as shown in FIG. 4, it is preferred that the wavelength region of light absorbed by the heat-diffusible coloring matter does not substantially overlap with the wavelength region of light to which the image forming layer has a sensitivity, since such overlapping between these wavelength regions may lower the sensitivity of the image forming layer part. Accordingly, it is sometimes preferred to use different components constituting the image-forming layer parts, respectively, corresponding to the color tones of the heat-diffusible coloring matters contained in the respective image-forming layer parts. In such a case, the respective image-forming layer parts 10Y, 10M and 10C ma have mutually different sensitive wavelength regions. Accordingly, the exposure device 15 may preferably be one capable of radiating plural species of lights having different wavelengths.

In FIG. 5, a reference numeral 16 denotes a heating roller for heating the image forming medium.

Figure 6:
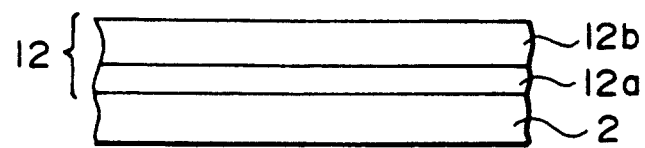
FIG. 6 is a schematic side sectional view showing another embodiment of the image forming medium according to the present invention.

The image forming medium according to the present invention may comprise an image forming layer having a multi-layer structure. For example, as shown in FIG. 6, an image forming layer 12 disposed on a support 2 may comprise, at least, a colorant layer 12a and a polymerizing layer 12b disposed in this order from the support 2 side. The colorant layer 12a may comprise at least a heat-diffusible coloring matter, and the polymerizing layer 12b may comprise at least a polymerizable binder and a polymerization initiator.

In order to form the colorant layer 12a, it is preferred to form a heat-diffusible coloring matter into a layer form by using the above-mentioned binder having no polymerizability.

The polymerizing layer 12b may be the same as the image forming layer 1 shown in FIG. 1 except that it does not contain a heat-diffusible coloring matter.

The contents of respective components constituting the image forming layer 12 may be the same as those in the case of the image forming layer 1 described hereinabove with reference to FIG. 1.

Figure 7:
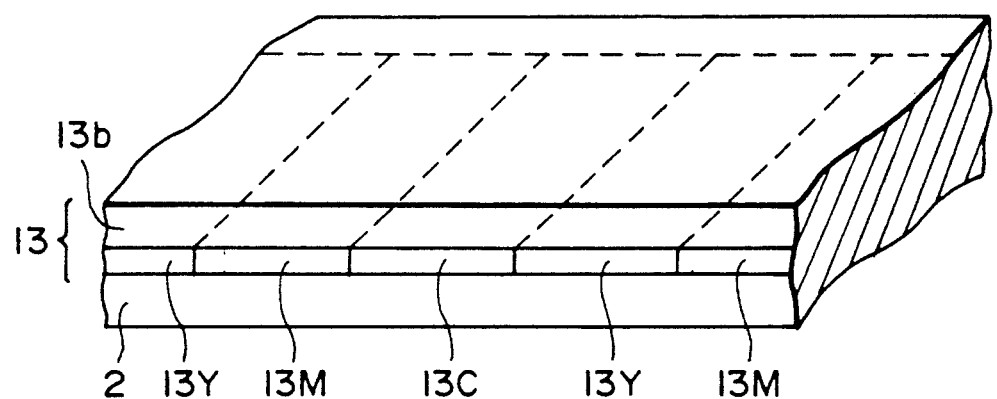
FIG. 7 is a schematic perspective view showing another embodiment of the image forming medium for multi-color recording according to the present invention.

In the present invention, the image forming medium for multi-color recording may also comprise an image forming layer having a multi-layer structure comprising plural layers. For example, as shown in FIG. 7, an image forming layer 13 disposed on a support 2 may comprise, at least, a colorant layer and a polymerizing layer 13b disposed in this order from the support 2 side. The colorant layer may comprise plural colorant layer parts 13Y, 13M and 13C having mutually different color tones disposed in a planar direction. The colorant layer parts 13Y, 13M and 13C contain heat-diffusible coloring matters having mutually different color tones, respectively. The components constituting the polymerizing layer 13b and respective color layer parts 13Y, 13M and 13C may be those in the case of the polymerizing layer 12b and colorant layer 12a, respectively, described with reference to FIG. 6. In order to effect multi-color recording by using the image forming medium as shown in FIG. 7, there may be utilized a recording method which is the same as that described above with reference to FIG. 5.

In an embodiment shown in FIG. 6 or 7, wherein the image forming layer is separated into the colorant layer and the polymerizing layer, the light for image exposure is not absorbed by the heat-diffusible coloring matter when the polymerizing layer is subjected to image exposure, whereby a decrease in sensitivity is obviated. In addition, in the case of the image forming medium for multi-color recording as shown in FIG. 7, it is not necessary to change the wavelength for the image exposure corresponding to the color tones of the respective colorant layer parts, whereby the image exposure may be effected by using light having a constant wavelength.

In the present invention it is also possible to utilize a photosensitive reaction of silver halide when a pattern comprising a polymerized portion and an unpolymerized portion is formed in an image forming layer. More specifically, in such an embodiment, at least a photosensitive silver halide, an organic silver salt, and a reducing agent may be incorporated into an image forming layer (or a polymerizing layer in the case of the image forming medium shown in FIG. 6 or in addition to a polymerizable binder and a polymerization initiator. Such an image forming medium may be subjected to image exposure and thermal development, and thereafter may be provided with an energy capable of polymerizing the polymerizable binder, thereby to provide a pattern comprising a polymerized portion and an unpolymerized portion.

In order to prevent the polymerization being inhibited by oxygen in the above-mentioned latent image formation step, it is possible to dispose a protective layer on the image forming layer of the image forming medium. The protective layer may for example be a layer comprising polyvinyl alcohol, polyvinylidene fluoride, polyester, etc. In addition, it is possible to dispose a primer or undercoat layer, between the image forming layer and support so that adhesive property therebetween may be improved.

As described hereinabove, the image forming medium or image forming method according to the present invention may provide a color image which has a good contrast, a high sensitivity and a high resolution, is excellent in brightness and saturation and is free of color fog. Further, when the image forming medium or image forming method according to the present invention is used, an image with good gradation may be formed by using easy control and easy operation.

Hereinbelow, the present invention will be explained in more detail while referring to specific examples of practice. In the description appearing hereinafter, "parts by weight" is abbreviated as "parts".

EXAMPLE 1

| | |
|---|---|
| MS Magenta VP (mfd. by Mitsui Toatsu Kagaku Senryo K.K.) | 0.6 part |
| Acrylic resin (trade name: Daianal BR-79, mfd. by Mitsubishi Rayon K.K.) | 7 parts |
| Methyl ethyl ketone | 63 parts |

A coating liquid was prepared by using the above-mentioned components, and the thus prepared coating liquid was applied onto a 25 micron-thick polyester film by means of an applicator so as to provide a coating having a thickness of 2 microns (after drying), thereby to form a colorant layer.

| | |
|---|---|
| Polyvinyl butyral-acrylic acid adduct (Mn (number - average molecular weight) = 32500, acryloyl group content = 70 groups/one molecule) | 1 part |
| Dipentaerythritol hexaacrylate (trade name: Kayarad DPHA, mfd. by Nihon Kayaku K.K.) | 1 part |
| 2,4-diethylthioxanthone (trade name: Kayacure DETX, mfd. by Nihon Kayaku K.K.) | 0.1 part |
| Ethyl d-dimethylaminobenzoate (trade name: Kayacure EPA, mfd. by Nihon Kayaku K.K.) | 0.1 part |
| n-butanol | 16 parts |

Separately, a coating liquid was prepared by using the above-mentioned components, and the thus prepared coating liquid was applied onto the colorant layer by means of an applicator so as to provide a coating having a thickness of 5-6 microns (after drying) to form a polymerizing layer, whereby an image forming medium according to the present invention as shown in FIG. 6 was obtained.

The above-mentioned polyvinyl butyral-acrylic acid adduct as a polymerizable binder was one prepared by reacting a polyvinyl butyral resin with acrylic acid chloride.

Then, a mask (comprising lines corresponding to 10 lines/mm) was disposed on the polymerizing layer of the image forming medium prepared above, and the image forming medium was exposed by supplying light to the polymerizing layer from the mask side, thereby to form therein a latent image. In this exposure operation, a fluorescent lamp (image surface illuminance=30 mJ/cm$^2$ S) having a fluorescent peak of 380 nm was used as a light source and was disposed at a distance of 3 cm from the polymerizing layer, and the exposure was conducted for 5 sec., while heating was simultaneously conducted at 105° C. so as to promote polymerization, whereby a latent image based on the mask was formed in the polymerizing layer.

Thereafter, the mask was separated from the image forming medium and then the resultant image forming medium was superposed on an image-receiving member (mfd. by Dainihon Insatsu K.K.) comprising synthetic paper and an image-receiving layer of a polyester resin disposed thereon so that the image forming layer carrying the above-mentioned latent image formed therein contacted the image-receiving layer, and the resultant superposition was passed between a pair of rollers (nip width=4 mm pressure=2 kg/cm$^2$) heated up to 100° C. at 1 mm/sec. As a result, a clear red image of coloring matter was provided on the image-receiving member.

In the above-mentioned transfer operation, the coloring matter contained in the unpolymerized portion was well transferred to the image-receiving layer so as to provide an optical density of 1.6 or higher (according to a reflection densitometer, tradename: Handy Reflection Densitomer DM-800, mfd. by Dainihon Screen K.K.) in the resultant transferred image. On the other hand, the coloring matter contained in the polymerized portion was not transferred to the image-receiving layer at all. As a result, the optical density of a portion of the image-receiving layer corresponding to the polymerized portion (i.e., a so-called "fog density") was 0.01-0.02 which was comparable to that in a portion of the image-receiving layer which had not been subjected to the transfer operation.

COMPARATIVE EXAMPLE 1

An image forming medium was prepared and subjected to image formation in the same manner as in Example 1 except for using a polyvinyl butyral resin (Mn (number-average molecular weight)=33500) having no polymerizing functional group instead of the polymerizable binder (polyvinyl butyral - acrylic acid adduct) used in Example 1.

As a result, the transferred image corresponding to the unpolymerized portion showed an optical density of 1.6 or higher, but the fog density was as high as about 0.3. In order to obtain a fog density of 0.01-0.02 which was the same as that in Example 1, an exposure time of about 60 sec was required.

EXAMPLE 2

| MS Yellow VP (mfd. by Mitsui Toatsu Kagaku K.K.) | 1 part |
|---|---|
| Acrylic resin (trade name: Daianal BR-79, mfd. by Mitsubishi Rayon K.K.) | 7 parts |
| Methyl ethyl ketone | 63 parts |

A coating liquid was prepared by using the above-mentioned components, and the thus prepared coating liquid was applied onto a polyester film in the same manner as in Example 1, thereby to form a colorant layer.

| Novalak-type epoxy-acrylate (Mn = 3300, acryloyl group content = 10 groups/one melecule) | 2 part |
|---|---|
| Dipentaerythritol hexaacrylate (Kayarad DPHA, mfd. by Nihon Kayaku K.K.) | 1 part |
| 2,4-diethylthioxanthone (Kayacure DETX, mfd. by Nihon Kayaku K.K.) | 0.2 part |
| Ethyl 4-dimethylaminobenzoate (Kayacure EPA, mfd. by Nihon Kayaku K.K.) | 0.2 part |
| n-butanol/methylethyl ketone (9:1) | 20 parts |

Separately, a coating liquid was prepared by using the above-mentioned components, and the thus prepared coating liquid was applied onto the colorant layer in the same manner as in Example 1 to form a polymerizing layer, whereby an image forming medium according to the present invention was obtained.

The above-mentioned novalak-type epoxy-acrylate as a polymerizable binder was one prepared by reacting a novalak-type epoxy resin with acrylic acid chloride.

The thus obtained image forming medium was subjected to exposure for 15 sec under the same conditions as in Example 1, and then the polymerizing layer was superposed on an image-receiving member and heated under the same conditions as in Example 1.

As a result, a clear yellow image of coloring matter was provided on the image-receiving member.

In the above-mentioned transfer operation, the coloring matter contained in the unpolymerized portion was well transferred to the image-receiving layer so as to provide an optical density of 1.5 or higher in the resultant transferred image. On the other hand, the coloring matter contained in the polymerized portion was not substantially transferred to the image-receiving layer. As a result, the fog density of a portion of the image-receiving layer corresponding to the polymerized portion was 0.03.

COMPARATIVE EXAMPLE 2

An image forming medium was prepared and subjected to image formation in the same manner as in Example 2 except for using an epoxy resin (Mn=3000) having no polymerizing functional group instead of the polymerizable binder (novalak-type epoxy-acrylate) used in Example 1.

As a result, the transferred image corresponding to the unpolymerized portion showed an optical density of 1.5 or higher, but the fog density was as high as about 0.4. In order to obtain a fog density of 0.03 which was the same as that in Example 2, an exposure time of about 90 sec was required.

EXAMPLE 3

NC\\C=C/CN attached to phenyl-N(CH₂CH₂CH₃)(CH₂)₃-phenyl  0.3 part

| | |
|---|---|
| Acrylic resin (trade name: Daianal BR-93, mfd. by Mitsubishi Rayon K.K.) | 3.5 parts |
| Styrene-maleic anhydride copolymer-acrylic acid adduct (Mn = 60 × 10⁴, acryloyl group content = 410 groups/one molecule) | 3.5 parts |
| Caprolactone-modified dipentaerythritol hexaacrylate (trade name: Kayarad DPCA-60, mfd. by Nihon Kayaku K.K.) | 2.0 parts |
| 2,4-diethylthioxantone (Kayarad DPHA, mfd. by Nihon Kayaku K.K.) | 0.3 part |
| ethyl 4-dimethylamionobenzoate | 0.3 part |
| Methyl ethyl ketone-n-butanol (1:4) | 80 parts |

A coating liquid was prepared by using the above-mentioned components, and the thus prepared coating liquid was applied onto a 25 micron-thick polyester film by means of an applicator so as to provide a coating having a thickness of 5–6 microns (after drying), whereby an image forming medium according to the present invention was obtained.

The above-mentioned styrene-maleic anhydride copolymer-acrylic acid adduct as a polymerizable binder was one prepared by reacting a styrene-maleic anhydride copolymer with hydroxyethyl acrylate.

The thus obtained image forming medium was subjected to exposure for 10 sec under the same conditions as in Example 1, and then the polymerizing layer was superposed on an image-receiving member and heated under the same conditions as in Example 1. As a result, a clear red image of coloring matter was provided on the image-receiving member.

In the above-mentioned transfer operation, the coloring matter contained in the unpolymerized portion was well transferred to the image-receiving layer so as to provide an optical density of 1.5 or higher in the resultant transferred image. On the other hand, the coloring matter contained in the polymerized portion was not substantially transferred to the image-receiving layer. As a result, the optical density of a portion of the image-receiving layer corresponding to the polymerized portion (i.e., a so-called "fog density") was 0.02.

COMPARATIVE EXAMPLE 3

An image forming medium was prepared and subjected to image formation in the same manner as in Example 3 except for using a styrene-maleic anhydride copolymer (Mn=57×10⁴) having no polymerizing functional group instead of the polymerizable binder used in Example 3.

As a result, the transferred image corresponding to the unpolymerized portion showed an optical density of 1.5 or higher, but the fog density was as high as about 0.7. In order to obtain a fog density of 0.02 which was the same as that in Example 3, an exposure time of about 150 sec was required.

EXAMPLE 4

| | |
|---|---|
| Kayaset Blue FR (mfd. by Nihon Kayaku K.K.) | 0.9 part |
| Acrylic resin (trade name: Daianal BR-79, mfd. by Mitsubishi Rayon K.K.) | 7 parts |
| Methyl ethyl ketone | 63 parts |

A coating liquid was prepared by using the above-mentioned components, and the thus prepared coating liquid was applied onto a polyester film in the same manner as in Example 1, thereby to form a colorant layer.

| | |
|---|---|
| Polyvinyl butyral-acrylic acid adduct (Mn = 34400, acryloyl group content = 110 groups/one melecule) | 1 part |
| Polyvinyl acetal resin (trade name: E-LEC KS-1, mfd. by Sekisui Kagaku Kogyo K.K.) | 1 part |
| Trimethylolpropane triacrylate (Kayarad TMPTA, mfd. by Nihon Kayaku K.K.) | 0.5 part |
| 2 4-diethylthioxanthone (Kayacure DETX, mfd. by Nihon Kayaku K.K.) | 0.1 part |
| Ethyl 4-dimethylaminobenzoate (Kayacure EPA, mfd. by Nihon Kayaku K.K.) | 0.1 part |
| n-heptanol/xylene (9:1) | 15 parts |

Separately, a coating liquid was prepared by using the above-mentioned components, and the thus prepared coating liquid was applied onto the colorant layer in the same manner as in Example 1 to form a polymerizing layer, whereby an image forming medium according to the present invention was obtained.

The above-mentioned polyvinyl butyral-acrylic acid adduct as a polymerizable binder was one prepared by reacting a polyvinyl butyral resin with acrylic acid.

The thus obtained image forming medium was subjected to exposure for 1 sec under the same conditions as in Example 1, and then the polymerizing layer was superposed on an image-receiving member and heated under the same conditions as in Example 1. As a result, a clear red image of coloring matter was provided on the image-receiving member.

In the above-mentioned transfer operation, the coloring matter contained in the unpolymerized portion was well transferred to the image-receiving layer so as to provide an optical density of 1.5 or higher in the resultant transferred image. On the other hand, the coloring matter contained in the polymerized portion was not substantially transferred to the image-receiving layer. As a result, the optical density of a portion of the image-receiving layer corresponding to the polymerized portion was 0.02.

COMPARATIVE EXAMPLE 4

An image forming medium was prepared and subjected to image formation in the same manner as in Example 4 except for using a polyvinyl butyral resin (Mn=33500) having no polymerizing functional group instead of the polymerizable binder used in Example 4.

As a result, the transferred image corresponding to the unpolymerized portion showed an optical density of 1.5 or higher, but the fog density was as high as about 0.5. In order to obtain a fog density of 0.02 which was the same as that in Example 4, an exposure time of about 15 sec was required.

EXAMPLE 5

An image forming medium was prepared in the same manner as in Example 1 except that an acrylic resin (Mn=555000, acryloyl group content=35 groups per one molecule) represented by the above-mentioned formula (VI) which had been obtained by reacting a styrene-methacrylic acid copolymer with glycidyl methacrylate was used as a polymerizable binder instead of the polyvinyl butyral-acrylic acid adduct used in Example 1.

The thus obtained image forming medium was subjected to exposure for 10 sec under heating at 120° C. in the same manner as in Example 1, and then was superposed on an image-receiving member and heated under the same conditions as in Example 1. As a result, a clear red image of coloring matter was provided on the image-receiving member.

In the above-mentioned transfer operation, the coloring matter contained in the unpolymerized portion was well transferred to the image-receiving layer so as to provide an optical density of 1.4 in the resultant transferred image. On the other hand, the coloring matter contained in the polymerized portion was not substantially transferred to the image-receiving layer. As a result, the fog density of a portion of the image-receiving layer corresponding to the polymerized portion was 0.02.

COMPARATIVE EXAMPLE 5

An image forming medium was prepared and subjected to image formation in the same manner as in Example 5 except for using an acrylic resin (molecular weight=55×10$^4$) having no polymerizing functional group instead of the polymerizable binder (acrylic resin) used in Example 5.

As a result, the transferred image corresponding to the unpolymerized portion showed an optical density of 1.4, but the fog density was as high as about 0.35. In order to obtain the same fog density as that in Example 5, an exposure time of about 80 sec was required.

EXAMPLE 6

| <Coating liquid for Yellow> | |
|---|---|
| MS Yellow VP (mfd. by Mitsui Toatsu Senryo K.K.) | 0.95 part |
| Acrylic resin (trade name: Daianal BR-79, mfd. by Mitsubishi Rayon K.K.) | 7 parts |
| Methyl ethyl ketone | 63 parts |
| <Coating liquid for Magenta> | |
| MS Magenta VP (mfd. by Mitsui Toatsu Senryo K.K.) | 0.6 part |
| Acrylic resin (trade name: Daianal BR-79, mfd. by Mitsubishi Rayon K.K.) | 7 parts |
| Methyl ethyl ketone | 63 parts |
| <Coating liquid for Cyan> | |
| MS Cyan VP (mfd. by Mitsui Toatsu Senryo K.K.) | 0.7 part |
| Acrylic resin (trade name: Daianal BR-79, mfd. by Mitsubishi Rayon K.K.) | 7 parts |
| Methyl ethyl ketone | 63 parts |

Three species of coating liquids were prepared by using the above-mentioned respective components, and each of the thus prepared coating liquids was applied onto a 25 micron-thick polyester film (width=20 cm) by means of an applicator so as to provide a coating having a thickness of 2 microns (after drying), thereby to form three species of colorant layer parts. The above-mentioned respective coating liquids were applied onto the above-mentioned film so that the coatings of respective colors were formed on the whole surface with respect to the width direction of the film, and the coating of respective colors having a length of 30 cm were formed in the longitudinal direction of the film in a sequence of yellow, magenta, and cyan.

Separately, a coating liquid was prepared by using the same components as in Example 1, and the thus prepared coating liquid was applied onto the colorant layer parts so as to provide a coating having a thickness of 5–6 microns (after drying) to form a polymerizing layer, whereby an image forming medium according to the present invention as shown in FIG. 7 was obtained.

Then, three color-separation lith films (lith film for plate-making, photosensitive material for phototype setting, trade name: Oriental Laser Film mfd. by Oriental Shashin Kogyo K.K.) for yellow, magenta and cyan which had been prepared for the purpose of printing were respectively superposed on the polymerizing layer of the image forming medium prepared above so that the lith films for the above-mentioned colors respectively correspond to the colorant layer parts of yellow, magenta and cyan, and the image forming medium was exposed by supplying light to the polymerizing layer from the lith film side, thereby to form therein a latent image. In this exposure operation, a fluorescent lamp (image surface illuminance=30 mJ/cm$^2$) having a fluorescent peak of 380 nm was used as a light source and was disposed at a distance of 3 cm from the polymerizing layer, while a heating was simultaneously conducted at 105° C. so as to promote polymerization. In this exposure step for latent image formation, exposure times were 5 sec, 3 sec, and 4 sec respectively corresponding to yellow, magenta and cyan regions.

Thereafter, the lith film was separated from the image forming medium and then the resultant image forming medium was subjected to image formation in the same manner as in Example 1 so as to provide a yellow image on an image-receiving paper. Then, the image-receiving paper carrying thereon the thus formed yellow image was superposed on the polymerizing layer corresponding to the magenta region and a magenta image was formed on the yellow image in the same manner as in the case of the yellow image formation. Further, a cyan image was similarly formed on the yellow and magenta images.

As a result, a multi-color image excellent in both of brightness and saturation was obtained.

What is claimed is:

1. An image forming medium, comprising:
   an image forming layer comprising at least a heat-diffusible coloring matter, a polymerizable binder and a polymerization initiator, wherein the polymerizable binder (i) has a molecular weight of 1×10$^4$ to 60×10$^4$, (ii) has a film-forming property, (iii) contains 10–700 ethylenically unsaturated polymerizing functional groups per binder molecule predominantly in side chains of the binder molecule and (iv) is represented by the following formula (II):

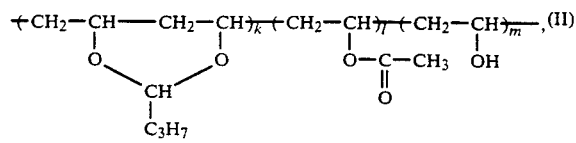

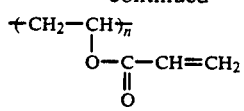

wherein k, l, m and n are integers adapted to provide the binder resin with the properties (i)-14 (iii) above; and the polymerization initiator is selected from he group consisting of at least a thermal polymerization initiator, a photopolymerization initiator, or a mixture thereof.

2. A medium according to claim 1, wherein the polymerizable binder contains 20 to 500 polymerizing functional groups per one molecule.

3. A medium according to claim 1, wherein the image forming layer contains a polymerizable compound other than the polymerizable binder.

4. A medium according to claim 1, wherein the image forming layer comprise plural species of image-forming layer parts having mutually different color tones disposed in a planar direction.

5. A medium according to claim 1, wherein the image forming layer is a laminate comprising (a) a polymerizing layer including (i) the polymerizable binder and (ii) the polymerization initiator, and (b) a coloring layer comprising the heat-fusible coloring matter.

6. A medium according to claim 1, wherein the image forming layer comprises at least a colorant layer and a polymerizing layer disposed thereon, and the colorant layer comprise plural species of colorant layer parts having mutually different color tones disposed in a planar direction.

7. An image forming method, comprising;
providing an image forming medium according to any of claims 1, 2, 3, and 5;
imparting a pattern of light or heat to the image forming medium to patternwise polymerize the image forming layer, thereby to form therein a latent image;
causing the image forming medium to contact an image-receiving member and heating the image forming medium, thereby to form an image corresponding to the patternwise polymerized image forming layer on the image-receiving member.

8. An image forming method, comprising;
(a) providing an image forming medium according to claim 4;
(b) imparting a pattern of light or heat to the image forming to patternwise polymerize the image-forming layer part, thereby to form therein a latent image;
(c) causing the image forming medium to contact a image-receiving member and heating the image forming medium, thereby to form an image corresponding to the patternwise polymerized image-forming layer part on the image-receiving member.

9. A method according to claim 8, wherein the steps (b) and (c) are repeated with respect to a plurality of the image-forming layer parts.

10. An image forming method, comprising;
(a) providing an image forming medium according to claim 6;
(b) imparting a pattern of light or heat to the image-forming medium to patternwise polymerize the polymerizing layer, thereby to form therein a latent image;
(c) causing the image forming medium to contact an image-receiving member and heating the image forming medium, thereby to form an image corresponding to the patternwise polymerized polymerizing layer on the image-receiving member.

11. A method according to claim 10, wherein the steps (b) and (c) are repeated with respect to a plurality of the colorant layer parts.

12. An image forming method, comprising:
providing an image forming medium according to any of claims 1, 2, 3 and 5;
imparting a pattern of light or heat to the image forming medium to patternwise polymerize the image forming layer, thereby to form therein a latent image; and
heating the image forming medium so that the heat-diffusible coloring matter may patternwise remain in the image forming layer.

13. A medium according o claim 1, wherein the polymerizable binder has a tensile strength of 10-800 kg/cm$^2$ as measured according to ASTM D638.

* * * * *

UNITED STATES PATENT AND TRADEMARK OFFICE
CERTIFICATE OF CORRECTION

PATENT NO. : 5,266,441
DATED : November 30, 1993
INVENTOR(S) : YUJI KONDO, ET AL.

It is certified that error appears in the above-indentified patent and that said Letters Patent is hereby corrected as shown below:

ON TITLE PAGE

In [63] Related U.S. Application Data:
"Ser. No. 942,600," should read --Ser. No. 924,600,--.

In [56] References Cited, under U.S. PATENT DOCUMENTS:
Insert --5,001,032  3/1991  Katayama et al.--.

COLUMN 2

Line 36, "comprising;" should read --comprising:--.
Line 46, "member" should read --member.--.
Line 48, "comprising;" should read --comprising:--.
Line 52, "forming" should read --forming medium--.
Line 60, "comprising;" should read --comprising:--.

COLUMN 4

Line 52, "rial." should read --rials.--.

COLUMN 6

Line 38, "novalak-type" should read --novolak-type--.

COLUMN 7

Line 21, "left-standing" should read --left standing--.

COLUMN 8

Line 47, "novalak-type" should read --novolak-type--.

UNITED STATES PATENT AND TRADEMARK OFFICE
CERTIFICATE OF CORRECTION

PATENT NO. : 5,266,441

DATED : November 30, 1993

INVENTOR(S) : YUJI KONDO, ET AL.

It is certified that error appears in the above-indentified patent and that said Letters Patent is hereby corrected as shown below:

COLUMN 9

Line 10, "presented" should read --represented--.

COLUMN 10

Formula (IV), "$-CH-\ OH$" should read -- $-\underset{|}{CH}-\ OH$ --.

Line 42, "Novolak-type" should read --novolak-type--.

Formula (V), "$-CH_2-$" (first occurrence) should read -- $-CH_2-$ --.

Line 67, "a" should be deleted.

COLUMN 11

Line 12, "he" should read --the--.
Line 39, "initiator" should read --initiator.--.
Line 43, "azobispropioni-" should read --azobis-propioni- --

COLUMN 15

Line 3, "ma" should read --may--.

COLUMN 16

Line 4, "FIG. 6 or in" should read --FIG. 6 or 7), in--.

COLUMN 18

Line 17, "Novalak-type" should read --Novolak-type--.
Line 19, "melecule)" should read --molecule)--.

UNITED STATES PATENT AND TRADEMARK OFFICE
CERTIFICATE OF CORRECTION

PATENT NO. : 5,266,441
DATED : November 30, 1993
INVENTOR(S) : YUJI KONDO, ET AL.

It is certified that error appears in the above-indentified patent and that said Letters Patent is hereby corrected as shown below:

COLUMN 18

Line 35, "novalak-type" should read --novolak-type--.
Line 60, "(novalak-type" should read --(novolak-type--.

COLUMN 19

Line 20, "4-dimethylamionobenzoate" should read --4-dimethylaminobenzoate--.

COLUMN 20

Line 18, "melecule)" should read --molecule)--.

COLUMN 22

Line 63, ",(II)" should read --(II),--.

COLUMN 23

Line 8, "(i)-14 (iii)" should read --(i) - (iii)--.
Line 10, "he" should read --the--.
Line 21, "comprise" should read --comprises--.
Line 33, "comprise" should read --comprises--.
Line 36, "comprising;" should read --comprising:--.

COLUMN 24

Line 3, "comprising;" should read --comprising:--.
Line 7, "forming" should read --forming medium--.
Line 9, "image;" should read --image; and--.

UNITED STATES PATENT AND TRADEMARK OFFICE
CERTIFICATE OF CORRECTION

PATENT NO. : 5,266,441
DATED : November 30, 1993
INVENTOR(S) : YUJI KONDO, ET AL.

It is certified that error appears in the above-indentified patent and that said Letters Patent is hereby corrected as shown below:

COLUMN 24

Line 10, "a" should read --an--.
Line 18, "comprising;" should read --comprising:--.
Line 24, "image;" should read --image; and--.
Line 43, "o" should read --to--.

Signed and Sealed this

Second Day of August, 1994

BRUCE LEHMAN

Attest:

Attesting Officer          Commissioner of Patents and Trademarks